Nov. 17, 1970 W. C. SLEMMER 3,541,464

DIFFERENTIAL AMPLIFIER HAVING CHARGE STORAGE DIODES IN THE EMITTER CIRCUITS

Filed Dec. 27, 1968

INVENTOR
W. C. SLEMMER
BY D. E. Snedeker
ATTORNEY

United States Patent Office 3,541,464

Patented Nov. 17, 1970

3,541,464

DIFFERENTIAL AMPLIFIER HAVING CHARGE STORAGE DIODES IN THE EMITTER CIRCUITS

William C. Slemmer, Chatham, N.J., assignor to Bell Telephone Laboratories, Incorporated, Murray Hill and Berkeley Heights, N.J., a corporation of New York

Filed Dec. 27, 1968, Ser. No. 787,471
Int. Cl. H03f *1/32, 3/04, 3/68*
U.S. Cl. 330—22 6 Claims

ABSTRACT OF THE DISCLOSURE

Respective charge storage diodes are connected into each of the branches of a conventional transistor differential amplifier circuit to increase the input voltage range without sacrificing the alternating current gain or high frequency response.

BACKGROUND OF THE INVENTION

This relates to differential amplifier circuits and more particularly to an improved differential amplifier having an increasing direct current differential dynamic range with maximum alternating current gain.

In present transistor differential amplifier circuits, resistors are frequently connected to the emitter terminals of the transistors to increase the range of differential input voltages for which the amplifier is operative. The addition of emitter resistors unfortunately decreases the amplifier gain with respect to fluctuating or alternating current (A.C.) input signals.

To overcome the sacrifice in A.C. gain which inherently results from the addition of emitter resistors, capacitors are frequently connected in circuit with the emitter resistors. This overcomes the loss in gain due to the emitter resistors, but the addition of the capacitors to the amplifier circuit increases the bulk and weight of the circuit. Moreover, the size of the capacitors required hinders manufacture of the differential amplifier in the form of an integrated circuit.

SUMMARY OF THE INVENTION

Accordingly, it is an object of this invention to provide a transistor differential amplifier which has both a large input voltage range and a large A.C. gain.

It is another object of this invention to provide a differential amplifier which is simple, compact, and readily amenable to integrated circuit techniques.

These and other objects are realized in an illustrative transistor differential amplifier circuit in which forward-biased charge storage diodes (that is, diodes having long minority carrier lifetimes) are connected to the emitter terminals of the transistors. The voltage across the charge storage diodes within a limited range is approximately proportional to the value of direct current (D.C.) flowing through them, and accordingly, like resistors, they increase the input voltage range of the differential amplifier. However, because of their long minority carrier lifetimes, the voltage across the charge storage diodes does not vary appreciably for short duration current changes, and as a result the gain of the differential amplifier is comparable to the gain it would have with no electrical components connected to the emitter terminals. Thus, the input voltage range of the basic differential amplifier is increased without a sacrifice in A.C. gain.

Furthermore, a differential amplifier constructed in accordance with this invention is simple, lightweight, and compact, and it can be easily fabricated using known integrated circuit techniques.

BRIEF DESCRIPTION OF THE DRAWING

A complete understanding of the present invention and the objects and features thereof may be gained from a consideration of the following detailed description of a specific illustrative embodiment thereof presented hereinbelow in connection with the accompanying drawing, in which.

DETAILED DESCRIPTION

Figure 1:
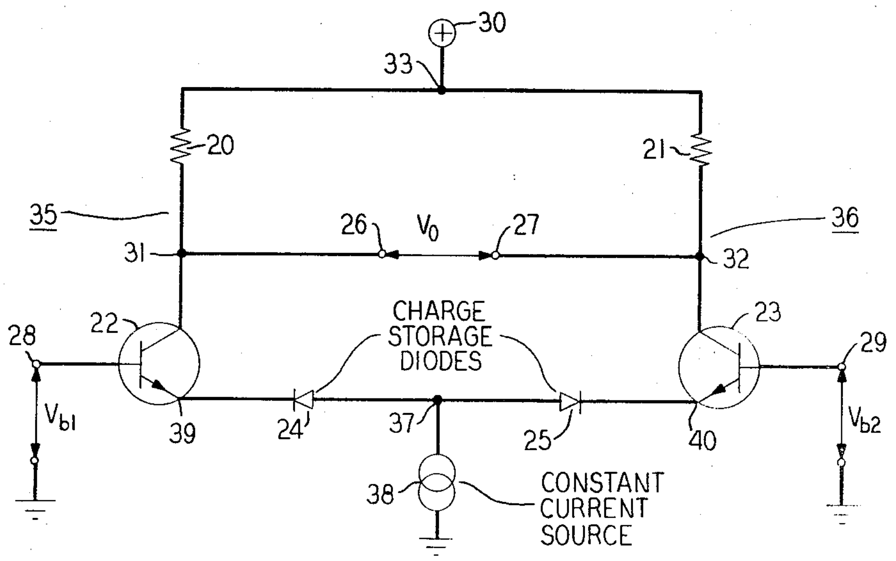
FIG. 1 is a schematic representation of an illustrative embodiment of a differential amplifier constructed in accordance with the principles of the invention.

The illustrative embodiment in FIG. 1 of the drawing shows a substantially conventional transistor differential amplifier configuration except for charge storage diodes 24 and 25. Voltage source 30 supplies current through point 33 to the two branches of the differential amplifier, designated 35 and 36, through respective matched output resistors 20 and 21. Transistor 22 is connected via the collector thereof to resistor 20 in branch 35 and transistor 23 is connected via its collector to resistor 21 in branch 36. The emitter leads 39 and 40 of transistors 22 and 23, respectively, are connected to ground (through charge storage diodes 24 and 25) via common point 37 through constant current source 38, which comprises any of a variety of known constant current sources and can, for example, be a constant current sink transistor.

The input voltages, shown as $V_{b1}$ and $V_{b2}$, are applied to the differential amplifier at respective base terminals 28 and 29 of transistors 22 and 23. The differential output voltage $V_0$ is obtained between terminals 26 and 27, which are connected respectively to points 31 and 32 in branches 35 and 36, and thus to the collectors of transistors 22 and 23, respectively. If the input voltages $V_{b1}$ and $V_{b2}$ are equal, the current from source 30 is split equally at point 33, and currents of equal magnitude flow through branches 35 and 36 providing zero output voltage $V_0$ between terminals 26 and 27. If, on the other hand, input voltages $V_{b1}$ and $V_{b2}$ are not equal, the current splits unequally through branches 35 and 36 in proportion to the different input voltages, providing a corresponding difference output voltage $V_0$ between terminals 26 and 27.

The input voltage range of the differential amplifier is determined by the absolute value of differential input voltage $V_{b1}-V_{b2}$ for which all of the current from source 30 flows through one or the other of branches 35 and 36. At this "cutoff" value of $V_{b1}-V_{b2}$, $V_0$ is at a maximum value $V_{0\ max.}$, which is defined by the value of the current supplied by source 30 multiplied by the value of either of identical resistors 20 and 21. For values of $V_{b1}-V_{b2}$ beyond this value, output voltage $V_0$ does not vary, and the amplifier obviously has no gain. Moreover, if the differential input voltage is in the immediate vicinity below the above-mentioned cutoff value, the amplifier exhibits highly nonlinear characteristics. Accordingly, the actual differential range of the amplifier is generally somewhat less than the cutoff value, as determined by the point where the amplifier gain characteristic becomes nonlinear.

In known transistor differential amplifiers, as mentioned above, a resistor is frequently connected in circuit with the emitter lead of each transistor (for example, in a position comparable to that if diodes 24 and 25 in FIG. 1). The addition of emitter resistors increases the cutoff value of the differential input voltage and thus increases the effective range throughout which the amplifier gain is linear. Since, as noted above, the maximum output voltage $V_{0\ max.}$ is dependent only on the magnitude of the constant current source and the value of the output resistors, an increase in input voltage range reduces the incremental variation of $V_0$ with respect to incremental changes in $V_{b1}-V_{b2}$. If $V_{0\ max.}$ is increased by increasing the value of the output resistors, the high frequency response of the amplifier is reduced and its gain bandwidth product is lowered. In short, the increase in input voltage range is obtained in known arrangements only at a cost of reduced A.C. gain or high frequency response.

According to the principles of my invention, however, the transistor differential amplifier embodiment shown in FIG. 1 further includes a pair of charge storage diodes 24 and 25, respectively, connected in circuit with the emitter leads 39 and 40 of transistors 22 and 23. Charge storage diodes 24 and 25 are thus connected in respective branches 35 and 36 and are poled in a forward direction away from emitter leads 39 and 40. Charge storage diodes are characterized by relatively long minority carrier lifetimes, illustratively on the order of one microsecond. Characteristically, when a charge storage diode is rapidly switched from a forward-biased to a reverse-biased condition, it acts like a potential source momentarily, thus producing a lag in its response to the voltage change. It will be apparent, of course, that other solid state devices having minority carrier lifetime characteristics similar to charge storage diodes, such as certain types of rectifier diodes and snap-off diodes, can be used in the differential amplifier of FIG. 1 without departing from the principles of this invention.

In the presence of D.C. currents, charge storage diodes have a substantially linear current-voltage characteristic similar to that of a resistor over a limited range. Accordingly, charge storage diodes 24 and 25 increase the dynamic input voltage range of the differential amplifier in basically the same manner as do emitter resistors, that is, by increasing the value of the differential input voltage at which the amplifier becomes nonlinear. In the presence of rapidly fluctuating A.C. voltages, however, charge storage diodes offer practically no impedance. Thus the requirement in known differential amplifier arrangements for emitter resistor bypass capacitors is eliminated, and the amplifier operates at high frequencies substantially as if there were no electrical components connected between each of emitter leads 39 and 40 and points 37. Therefore, the input range of an amplifier according to my invention is increased, while the A.C. gain of the amplifier advantageously does not decrease significantly from the presence of charge storage diodes 24 and 25.

The principles of this invention can be applied to other known differential amplifier configurations. For example, FIG. 2, in which similarly numbered elements are identical to those shown in FIG. 1, shows another illustrative differential amplifier embodiment having charge storage diodes 24 and 25 poled in a reverse direction toward the emitter leads 39 and 40 of transistors 22 and 23, respectively. Emitter leads 39 and 40 are connected to ground through respective matched constant current sources 38A and 38B. Charge storage diodes 24 and 25 are forward-biased by current from voltage source 50 and constant current source 51 through point 37. Conduction paths 35 and 36 contain substantially the same electrical components as paths 35 and 36 in FIG. 1, but are respectively connected at one end to matched voltage sources 30A and 30B.

The output voltage $V_0$ between terminals 26 and 27 behaves in a similar manner to the output voltage of the amplifier shown in FIG. 1. When input voltages $V_{b1}$ and $V_{b2}$ are equal, the constant current from source 50 through constant current source 51 splits equally at point 37 and currents of equal magnitude flow through charge storage diodes 24 and 25. Thus, since constant current sources 38A and 38B are matched, currents of equal magnitude flow respectively through resistors 20 and 21, and output voltage $V_0$ is equal to zero. If input voltages $V_{b1}$ and $V_{b2}$ are not equal, the respective currents flowing through resistors 20 and 21 are of unequal magnitude in proportion to the different input voltages, and a corresponding difference output voltage $V_0$ is provided between terminals 26 and 27.

Figure 2:
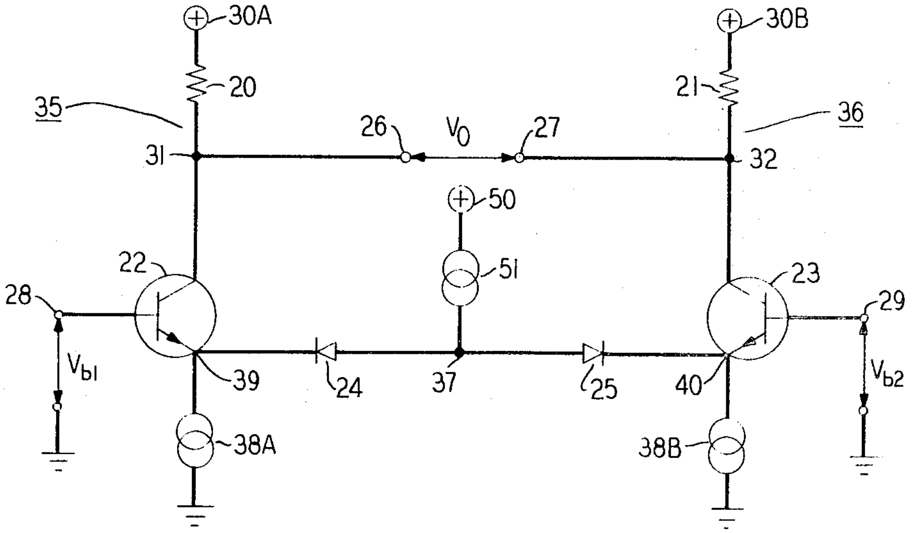
FIG. 2 is a schematic representation of another illustrative embodiment of a differential amplifier constructed in accordance with the principles of the invention.

Charge storage diodes 24 and 25 increase the input voltage range for the differential amplifier shown in FIG. 2 by providing, in effect, emitter resistance for transistors 22 and 23. At A.C. frequencies, however, charge storage diodes 24 and 25 present substantially no impedance between the emitters of transistors 22 and 23, and accordingly the gain of the amplifier is maintained at a high level, as if no electrical components were connected between emitter terminals 39 and 40.

In addition to the illustrative embodiments of FIGS. 1 and 2, it will be apparent that other arrangements of the invention may be constructed to meet the requirements of particular applications. For example, additional charge storage diodes may be connected in series with each of charge storage diodes 24 and 25, shown in FIGS. 1 and 2, to increase the input voltage range still further. Moreover, the embodiments of FIGS. 1 and 2 may be combined by, for example, connecting additional forward-biased charge storage diodes respectively between emitter leads 39 and 40 and constant current sources 38A and 38B in FIG. 2.

It will be readily apparent that differential amplifiers in accordance with my invention, such as those shown in FIGS. 1 and 2, can be constructed advantageously using lightweight, compact elements and are readily integrable using, for example, air isolated monolithic or dielectric isolation techniques.

It is to be understood that the above-described arrangements are merely illustrative of the principles of the present invention. Numerous other arrangements may be devised by those skilled in the art without departing from the spirit and scope of the invention.

What is claimed is:

1. A differential amplifier comprising: first and second amplifying means each having first, second, and third terminals, first and second parallel conduction paths including said first and second amplifying means, respectively, connected serially therein through said first and second terminals, and first and second output resistors connected to said first terminals of said first and second amplifying means, respectively; means for supplying current to said first and second conductor paths; respective input terminals connected to said third terminals of said first and second amplifying means; and a pair of output terminals respectively connected to said first terminals of said first and second amplifying means; wherein the improvement resides in means for increasing the input voltage range of said amplifier, said means comprising first and second solid state devices having long minority carrier lifetimes and being connected to said second terminals of said first and second amplifying means, respectively.

2. A differential amplifier in accordance with claim 1 wherein said first and second amplifying means comprise first and second transistors, respectively, and wherein said first, second, and third terminals respectively comprise collector, emitter, and base terminals of said transistors.

3. A differential amplifier in accordance with claim 2 wherein said first and second solid state devices comprise first and second charge storage diodes, respectively.

4. A differential amplifier in accordance with claim 3 wherein said current supplying means comprises a current source connected in common to said first and second conduction paths and wherein said first and second charge storage diodes are poled away from said emitter terminals of said first and second transistors.

5. A differential amplifier in accordance with claim 3 wherein said first and second charge storage diodes are poled toward said first and second transistors, respectively, and are connected between said emitter terminals of said first and second transistors, said amplifier additionally comprising a current source connected to said first and second diodes such that said diodes are both forward-biased.

6. A differential amplifier in accordance with claim 5 wherein said current supplying means comprises first and second constant current sources connected to said emitter terminals of said first and second transistors, respectively.

References Cited

UNITED STATES PATENTS 3,392,346 7/1968 Staubus.

OTHER REFERENCES

Poppelbaum et al., Electronics, Sept. 4, 1967, pp. 106–108.

ROY LAKE, Primary Examiner

S. H. GRIMM, Assistant Examiner

U.S. Cl. X.R.

307—319; 330—24, 30, 40, 69